United States Patent
Gutala et al.

(10) Patent No.: US 11,237,757 B2
(45) Date of Patent: Feb. 1, 2022

(54) DATA STORAGE FOR ACCELERATING FUNCTIONS

(71) Applicant: Intel Corporation, Santa Clara, CA (US)

(72) Inventors: Ravi Gutala, San Jose, CA (US); Aravind Dasu, Milpitas, CA (US)

(73) Assignee: Intel Corporation, Santa Clara, CA (US)

(*) Notice: Subject to any disclaimer, the term of this patent is extended or adjusted under 35 U.S.C. 154(b) by 889 days.

(21) Appl. No.: 15/645,951

(22) Filed: Jul. 10, 2017

(65) Prior Publication Data

US 2019/0012116 A1 Jan. 10, 2019

(51) Int. Cl.
*G06F 3/06* (2006.01)
*H03K 19/00* (2006.01)
*G06F 15/76* (2006.01)
*G06F 30/00* (2020.01)

(52) U.S. Cl.
CPC .......... *G06F 3/0659* (2013.01); *G06F 3/0611* (2013.01); *G06F 3/0632* (2013.01); *G06F 3/0679* (2013.01); *G06F 15/76* (2013.01); *G06F 30/00* (2020.01); *H03K 19/00* (2013.01)

(58) Field of Classification Search
CPC .... G06F 3/0611; G06F 3/0632; G06F 3/0659; G06F 3/0679; G06F 15/7807
See application file for complete search history.

(56) References Cited

U.S. PATENT DOCUMENTS

| | | | |
|---|---|---|---|
| 9,589,612 B1 | 3/2017 | Rahman et al. | |
| 9,633,872 B2 | 4/2017 | Chen et al. | |
| 2008/0296697 A1 | 12/2008 | Hsu et al. | |
| 2015/0121037 A1* | 4/2015 | Van Lunteren | G06F 9/3824 |
| | | | 712/30 |
| 2016/0321094 A1* | 11/2016 | Rabi | G06F 9/45558 |
| 2016/0379686 A1* | 12/2016 | Burger | G06F 3/0604 |
| | | | 711/170 |
| 2018/0284992 A1* | 10/2018 | Haller | G06F 3/0607 |

OTHER PUBLICATIONS

U.S. Appl. No. 15/358,665, filed Nov. 22, 2016, pp. 1-36.

* cited by examiner

*Primary Examiner* — Aracelis Ruiz
(74) *Attorney, Agent, or Firm* — InventIQ Legal LLP; Steven J. Cahill

(57) ABSTRACT

An integrated circuit package includes a memory integrated circuit die and a coprocessor integrated circuit die that is coupled to the memory integrated circuit die. The coprocessor integrated circuit die has a logic sector that is configured to accelerate a function for a host processor. The logic sector generates an intermediate result of a computation performed as part of the function. The intermediate result is transmitted to and stored in the memory integrated circuit die.

20 Claims, 11 Drawing Sheets

DATA STORAGE FOR ACCELERATING FUNCTIONS

FIELD OF THE DISCLOSURE

The present disclosure relates to electronic circuit systems, and more particularly, to techniques for storing data that is used to accelerate functions.

BACKGROUND

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements to configure the devices to perform the functions of the custom logic circuit.

Configuration data may be supplied to a programmable device in the form of a configuration bit stream. After a first configuration bit stream has been loaded onto a programmable device, the programmable device may be reconfigured by loading a different configuration bit stream in a process known as reconfiguration. An entire set of configuration data is often loaded during reconfiguration.

Programmable devices may be used for processing in big-data or fast-data applications. For example, programmable devices may be used in application acceleration tasks in a datacenter and may be reprogrammed during datacenter operation to perform different tasks. However, the speed of reconfiguration of programmable devices is traditionally several orders of magnitude slower than the desired rate of virtualization in datacenters. Moreover, on-chip caching or buffering of pre-fetched configuration bit streams to hide the latency of reconfiguration is undesirably expensive in terms of silicon real estate. Additionally, repeated fetching of configuration bit streams from off-chip storage via the entire configuration circuit chain is energy intensive.

DETAILED DESCRIPTION

Figure 1:
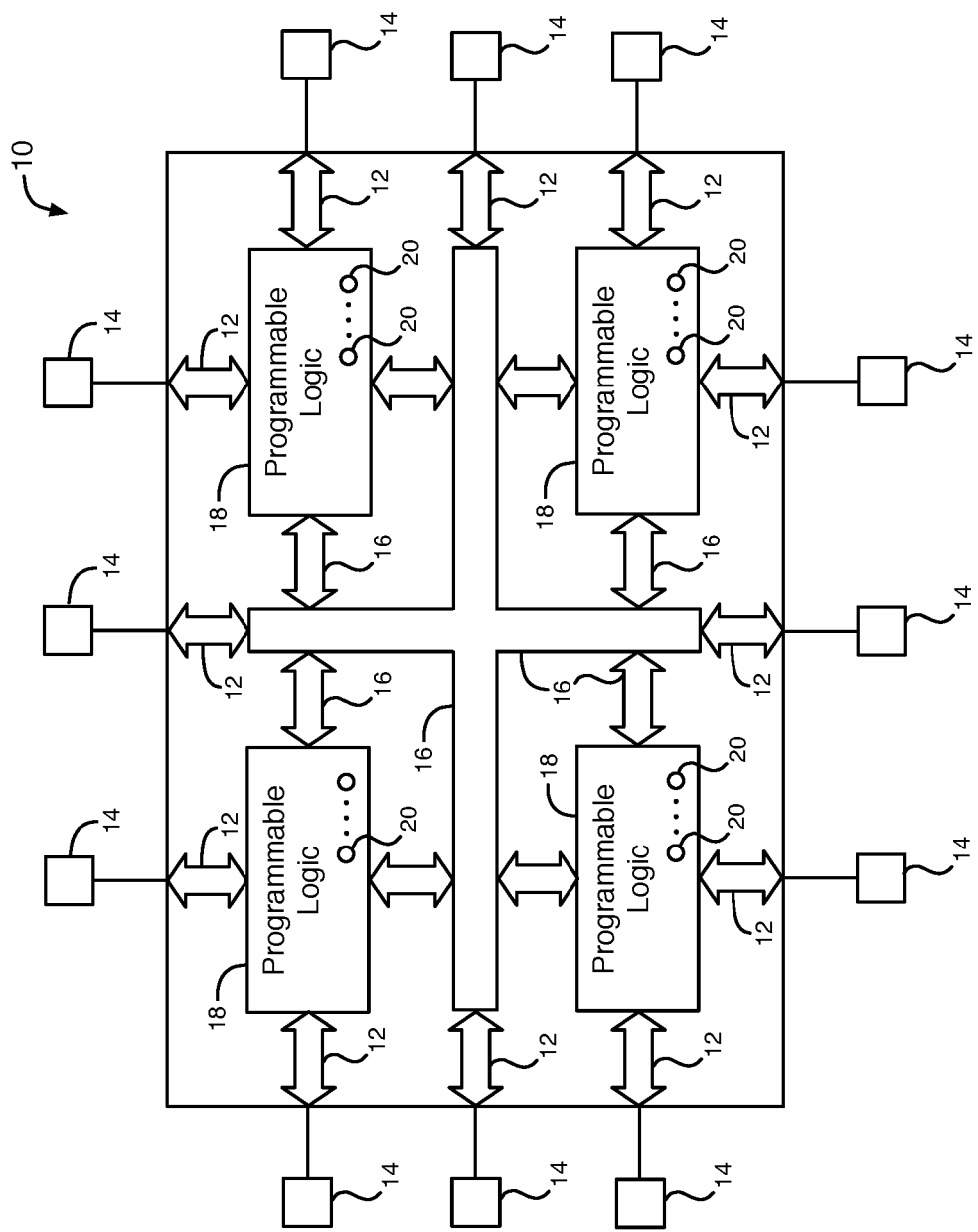
FIG. 1 is a diagram of an illustrative programmable integrated circuit in accordance with an embodiment.

According to some embodiments, a host processor may be tasked to perform a pool of jobs/tasks. In order to improve the speed at which these tasks are performed, a coprocessor integrated circuit (IC) die may be used to perform a subset of the pool of tasks. The host processor may send an acceleration request to the coprocessor IC die. Thus, the coprocessor IC die functions as an accelerator circuit. This acceleration request may be received by a secure device manager in the coprocessor IC die, which may identify one or more logic sectors that are available to accelerate one or more functions associated with the acceleration request.

During an execution phase, the secure device manager may communicate with local sector managers at each of the logic sectors to determine whether any of the logic sectors are already configured to carry out the function to be accelerated. If it is determined that such a pre-configured sector exists, that sector may be selected and used to execute the function to be accelerated. Functions that are accelerated by a coprocessor may include processor threads and tasks.

If it is determined that such a pre-configured sector does not exist, the host processor may provide the local sector manager of an available sector with a pointer to the location of the configuration data required for accelerating the function. This configuration data may be stored in one or more memory integrated circuit (IC) dies within the same integrated circuit (IC) package as the coprocessor IC die. If it is determined that the required configuration data is stored in a memory IC die in the IC package, the required configuration data is retrieved from the memory IC die and used to reconfigure the available sector.

However, in some cases, the required configuration data may not be present in a memory IC die within the IC package. The local sector manager may determine whether the required configuration data is present in a memory IC die in the IC package. If it is determined that the required configuration data is not stored in a memory IC die in the IC package, the local sector manager of the available sector may send a request to the host processor requesting the host processor to provide the required configuration data to a memory IC die in the IC package. The local sector manager may then load the required configuration data into the available sector, thereby reconfiguring the available sector for accelerating the function.

According to other embodiments, one or more logic sectors may perform multi-part computations to accelerate a function for the host processor. A logic sector may generate intermediate results of the multi-part computations performed to accelerate the function. The coprocessor IC die may not have enough available storage space to store all of the intermediate results of the computations for the function being accelerated. Thus, the intermediate results of the computations may be transmitted to and stored in one or more memory IC dies that are in the same IC package as the coprocessor IC die. The intermediate results are then transmitted from the one or more memory IC dies back to the coprocessor IC die in response to a request from the logic sectors that the intermediate results are needed for additional parts of the computations for the function being accelerated.

Programmable integrated circuits use programmable memory elements to store configuration data. Configuration data may be generated based on source code corresponding to application-specific tasks to be performed in parallel on the programmable integrated circuit. During programming of a programmable integrated circuit, configuration data is loaded into the memory elements. The memory elements may be organized in arrays having numerous rows and columns. For example, memory array circuitry may be formed in hundreds or thousands of rows and columns on a programmable logic device integrated circuit.

During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

It may sometimes be desirable to configure or reconfigure the programmable integrated circuit as an accelerator circuit to efficiently perform parallel processing tasks. In these embodiments, the programmable integrated circuit functions as the coprocessor integrated circuit described above. The accelerator circuit may include soft processors of various types that are specialized for different types of parallel tasks. The accelerator circuit may be dynamically reconfigured to optimally assign and perform the parallel tasks.

An illustrative programmable integrated circuit such as programmable logic integrated circuit 10 is shown in Figure (FIG. 1. Programmable logic integrated circuit (IC) 10 may be, for example, a programmable logic device (PLD) or a field programmable gate array (FPGA). As shown in FIG. 1, programmable logic IC 10 may have input-output circuitry 12 for driving signals off of IC 10 and for receiving signals from other devices via input-output pins 14. Interconnection resources 16 such as global and local vertical and horizontal conductive lines and buses may be used to route signals in IC 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable logic integrated circuit 10 contains memory elements 20 that can be loaded with configuration data (also called programming data) using pins 14 and input-output circuitry 12. Once loaded, the memory elements 20 may each provide a corresponding static control output signal that controls the state of an associated logic component in programmable logic 18. Typically, the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output signal is high, an NMOS pass transistor controlled by that memory element is turned on to pass logic signals from its input to its output. When the memory element output signal is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random access memory (CRAM) cells.

Figure 2:
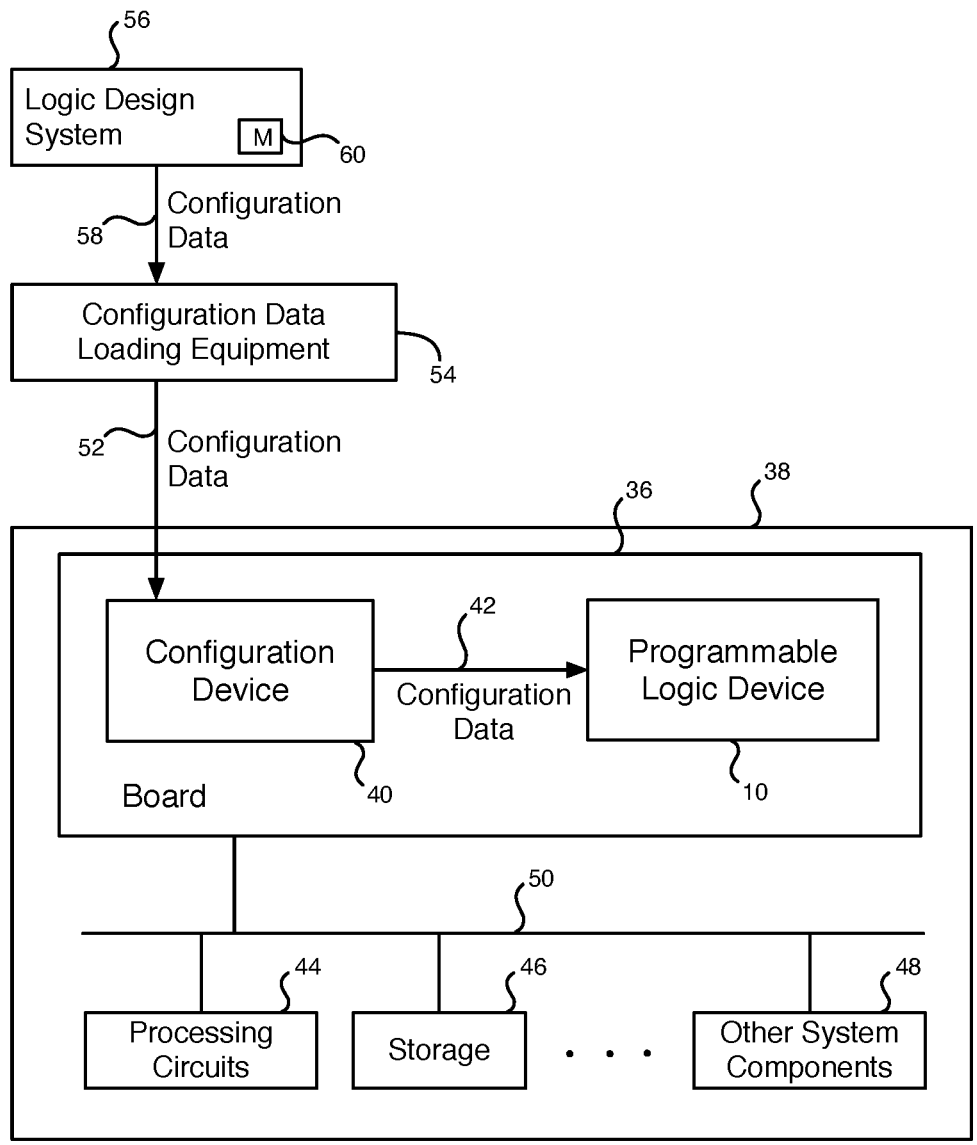
FIG. 2 is a diagram showing how configuration data is created by a logic design system and loaded into a programmable device to configure the device for operation in a system in accordance with an embodiment.

An illustrative system environment for IC 10 is shown in Figure (FIG. 2. IC 10 may be mounted on a board 36 in a system 38. In general, programmable IC 10 may receive configuration data from programming equipment or from other suitable equipment or device. In the example of FIG. 2, programmable IC 10 is the type of programmable logic device that receives configuration data from an associated integrated circuit 40. With this type of arrangement, circuit 40 may, if desired, be mounted on the same board 36 as programmable IC 10.

Circuit 40 may be an erasable-programmable read-only memory (EPROM) chip, a programmable logic device configuration data loading chip with built-in memory (sometimes referred to as a "configuration device"), or another suitable device. When system 38 boots up (or at another suitable time), the configuration data for configuring the programmable logic device 10 may be supplied to the programmable logic device from device 40, as shown schematically by path 42. The configuration data that is supplied to the programmable logic device 10 may be stored in the programmable logic device in its configuration random-access-memory elements 20.

System 38 may include processing circuits 44, storage 46, and other system components 48 that communicate with IC 10. The components of system 38 may be located on one or more boards such as board 36 or other suitable mounting structures or housings and may be interconnected by buses, traces, and other electrical paths 50.

Configuration device 40 may be supplied with the configuration data for IC 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable IC 10 over path 42. Logic design system 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable IC 10 are used to load the configuration data into CRAM cells 20 of IC 10. IC 10 may then be used in normal operation of system 38.

After IC 10 is initially loaded with a set of configuration data (e.g., using configuration device 40), IC 10 may be reconfigured by loading a different set of configuration data. Sometimes it may be desirable to reconfigure only a portion of the memory cells on IC 10 via a process sometimes referred to as partial reconfiguration. As memory cells are typically arranged in an array, partial reconfiguration can be performed by writing new data values only into selected portion(s) in the array while leaving portions of the array other than the selected portion(s) in their original state.

Figure 3:
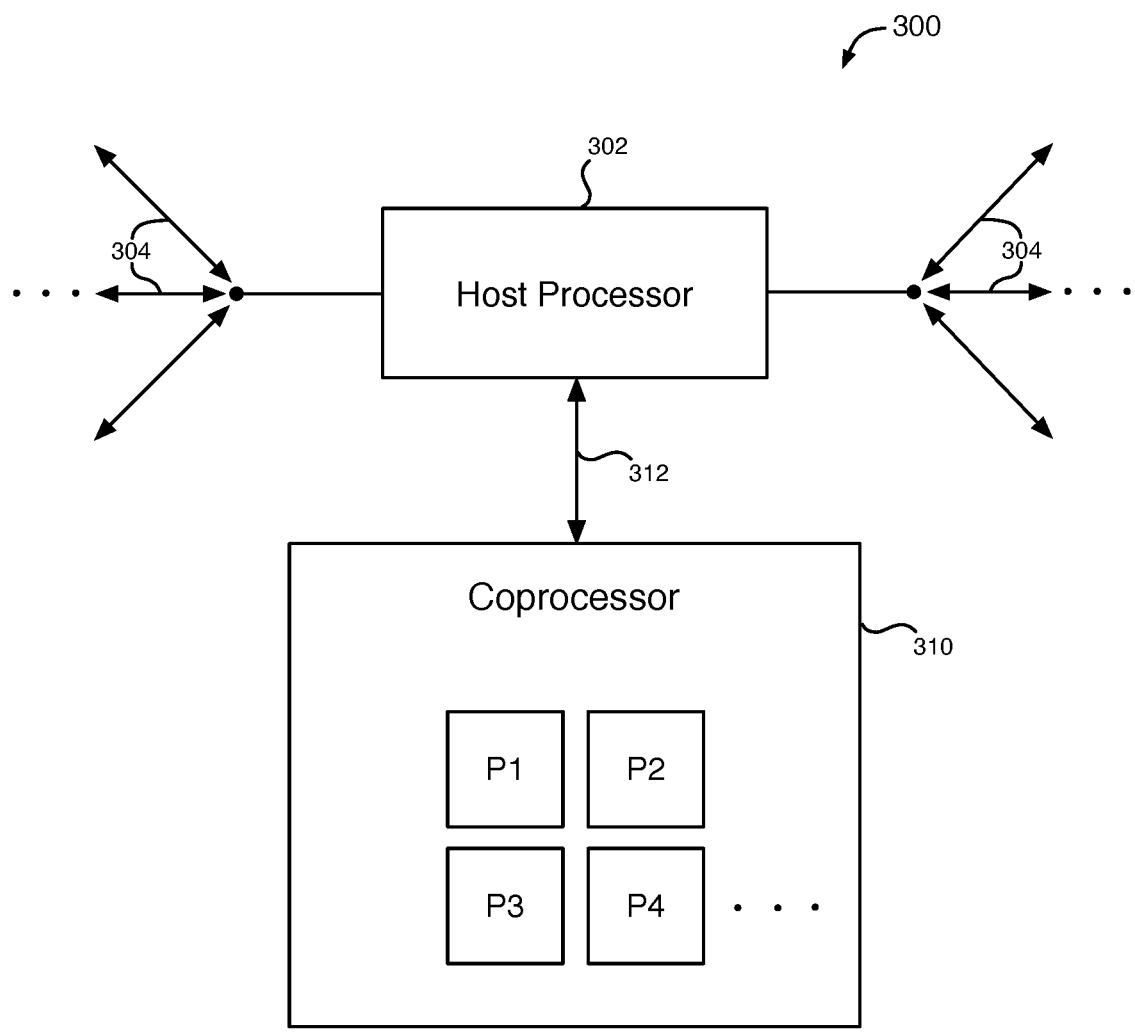
FIG. 3 is a diagram showing how a programmable integrated circuit may be used as a coprocessor in support of a host processor in accordance with an embodiment.

Partial reconfiguration may be a particularly useful feature when developing an acceleration framework. For example, consider a scenario in which a system such as system 300 includes a host processor 302 that is coupled to other network components via paths 304 (see, e.g., FIG. 3). As shown in FIG. 3, host processor 302 may be coupled to a coprocessor circuit 310 via path 312. Coprocessor circuit 310 is in an integrated circuit (IC) die and is also referred to herein as coprocessor IC die 310. Coprocessor circuit 310 may be, for example, a programmable integrated circuit such as IC 10 of FIG. 1. Alternatively, multiple coprocessor or accelerator circuits may be in a programmable integrated circuit. Host processor 302 is in an integrated circuit die that is separate from the coprocessor integrated circuit die 310. Coprocessor circuit 310 functions as an accelerator circuit for host processor 302. As an accelerator circuit, coprocessor circuit 310 may include various processing nodes (e.g., processing cores, processor cores) such as cores P1-P4 to help accelerate the performance of host processor 302. Cores P1-P4 may be soft processor cores or soft processors that are configurable (e.g., programmable). In some instances, processor cores such as cores P1-P4 may be implemented as logic sectors in coprocessor circuit 310.

Configured as such, coprocessor circuit 310 may sometimes be referred to as an "accelerator circuit" or as a "hardware accelerator." As examples, the processing cores on the coprocessor 310 may be used to accelerate a variety of functions, which may include but are not limited to: encryption/decryption, Fast Fourier transforms, video encoding/decoding, convolutional neural networks (CNN), firewalling, intrusion detection, database searching, domain name service (DNS), load balancing, caching network address translation (NAT), and other suitable network packet processing applications, just to name a few.

Figure 4:
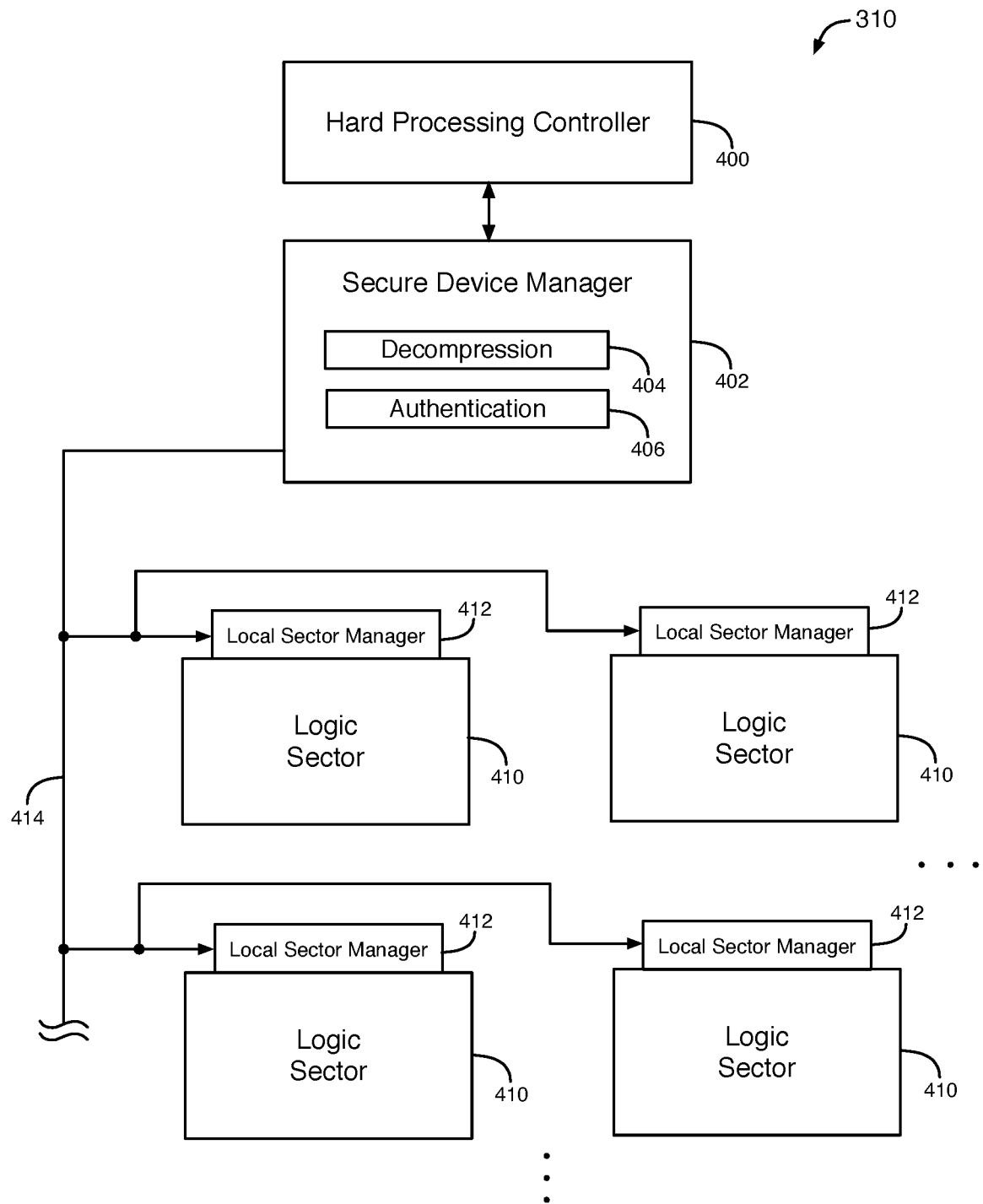
FIG. 4 is a diagram of an illustrative programmable integrated circuit having multiple logic sectors managed by local sector managers and a secure device manager in accordance with an embodiment.

For instances in which cores P1-P4 are implemented as logic sectors in coprocessor circuit 310, each logic sector may be managed using local sector managers, which may in turn be managed using a secure device manager. As shown in FIG. 4, coprocessor circuit 310 may include multiple logic sectors 410 (sometimes referred to as sectors 410). Each logic sector 410 may be managed by a respective one of local sector managers (LSM) 412. Local sector managers 412 may be managed by secure device manager 402. Hard processing controller 400 may receive configuration data (e.g., configuration bit streams) and/or accelerator requests from a host processor (e.g., host processor 302 of FIG. 3). Secure device manager 402 may receive the configuration data, the accelerator requests, and commands from hard processing controller 400. Hard processing controller 400 may, for instance, be a microprocessor. Secure device manager 402 may provide commands, configuration data, and acceleration requests to local sector managers 412 over a bus 414.

In some instances, the configuration data and accelerator requests may optionally be compressed and authenticated. Thus, secure device manager 402 may include decompression engine 404 and authentication engine 406 for decompressing and authenticating data received from the host processor through hard processing controller 400.

Logic sectors 410 may be individually configurable/programmable. This allows each of logic sectors 410 to independently process different functions in parallel. The parallel processing enabled by logic sectors 410 may be utilized to perform application acceleration (e.g., in a datacenter) for a variety of functions simultaneously by reconfiguring different subsets of the logic sectors to perform the functions.

In order to efficiently manage application acceleration as new functions are issued to coprocessor circuit 310 from the host processor, it may be necessary to perform real-time reconfiguration on any of logic sectors 410 that will be used to process a given newly received function. In other words, reconfiguration of logic sectors 410 may be performed while coprocessor circuit 310 is running and may be performed without interrupting the operation of coprocessor circuit 310.

The selection of which of logic sectors 410 are to be used for a given function may be determined by identifying which sectors are idle (e.g., not presently performing a function) and by identifying which sectors are handling lower-priority functions (e.g., functions without a fixed time budget) compared to the priority of the given function. Some or all of logic sectors 410 that are identified as being idle or as performing less critical functions may then be selected, and if necessary, reconfigured to perform operations of the given function. Reassignment of logic sectors 410 that are working on a lower-priority function than the given function in need of sector assignment may be performed based on a load-balancing mechanism. It should be noted that those logic sectors 410 that are identified as already being configured to perform the given function may be given selection priority over any sectors that would need to be reconfigured to perform the function.

Figure 5:
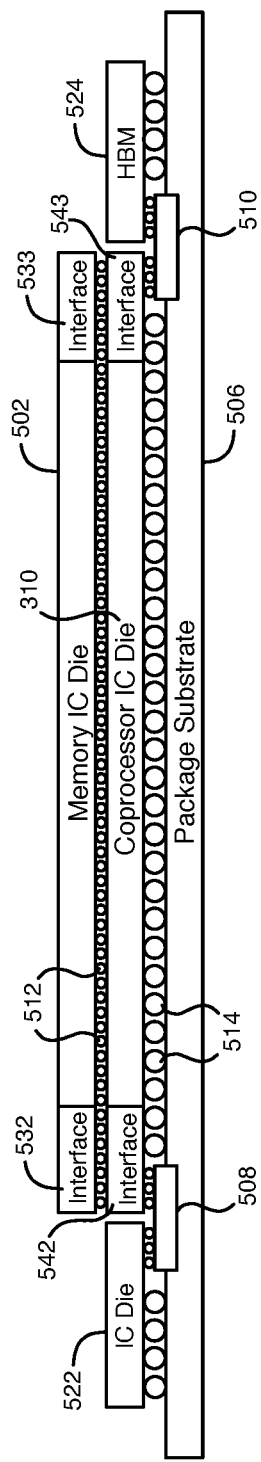
FIG. 5 illustrates an example of a memory integrated circuit (IC) die that stores configuration data for and/or intermediate results of functions to be accelerated by a coprocessor IC die functioning as an accelerator circuit for a host processor, according to an embodiment.

FIG. 5 illustrates an example of a memory integrated circuit (IC) die 502 that stores configuration data for and/or intermediate results of functions to be accelerated by a coprocessor IC die 310 functioning as an accelerator circuit for a host processor 302, according to an embodiment. The integrated circuit (IC) package shown in FIG. 5 includes memory IC die 502, coprocessor IC die 310, package substrate 506, interconnect bridges 508 and 510, IC die 522, and high bandwidth memory (HBM) IC die 524. As shown in FIG. 5, memory IC die 502 is stacked vertically on top of coprocessor IC die 310 within the IC package to provide an extendable high density memory using a three dimensional IC stack. Memory IC die 502 is coupled to coprocessor IC die 310 through conductive micro-bumps 512. Memory IC die 502 may be, for example, a static random access memory (SRAM) IC die, a dynamic random access memory (DRAM) IC die, a non-volatile memory IC die, or another type of memory IC die. Coprocessor IC die 310 may be, for example, a programmable integrated circuit, such as a programmable logic device or a field programmable gate array (FPGA). Coprocessor IC die 310 is coupled to the package substrate 506 of the IC package through conductive solder bumps 514.

In an embodiment, memory IC die 502 may be coupled to coprocessor IC die 310 through through-silicon vias (TSVs) that pass through one or more layers of coprocessor IC die 310. The TSVs in IC die 310 may allow memory IC die 502 to load configuration data and intermediate results of functions into sectors 410 of coprocessor IC die 310 at a high speed.

Figure 6:
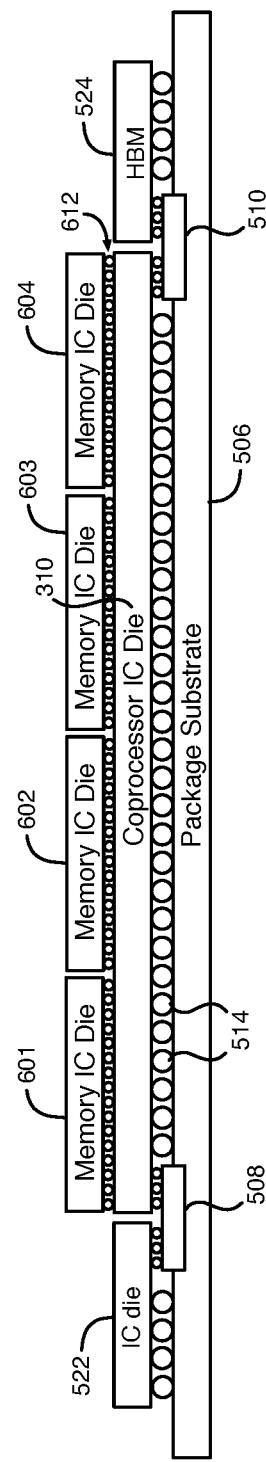
FIG. 6 is a diagram that illustrates an example of four memory integrated circuit (IC) dies that store configuration data for and/or intermediate results of functions to be accelerated by a coprocessor IC die functioning as an accelerator circuit for a host processor, according to another embodiment.

FIG. 6 is a diagram that illustrates an example of four memory integrated circuit (IC) dies 601, 602, 603, and 604 that store configuration data for and/or intermediate results of functions to be accelerated by a coprocessor IC die 310 functioning as an accelerator circuit for a host processor 302, according to another embodiment. The integrated circuit (IC) package shown in FIG. 6 includes memory IC dies 601-604, coprocessor IC die 310, package substrate 506, interconnect bridges 508 and 510, IC die 522, and HBM IC die 524. As shown in FIG. 6, memory IC dies 601-604 are stacked vertically on top of coprocessor IC die 310 within the IC package to provide an extendable high density memory. Memory IC dies 601-604 are coupled to coprocessor IC die 310 through conductive micro-bumps 612. Memory IC dies 601-604 may be, for example, SRAM IC dies, DRAM IC dies, non-volatile memory IC dies, or other types of memory IC dies.

In an embodiment, the memory IC dies 601-604 of FIG. 6 may be coupled to coprocessor IC die 310 through through-silicon vias (TSVs) that pass through one or more layers of coprocessor IC die 310. The TSVs in IC die 310 may allow memory IC dies 601-604 to load configuration data and intermediate results of functions into sectors 410 of coprocessor IC die 310 at a high speed.

Circuitry in the logic sectors 410 can perform multi-part computations for functions that are being accelerated for the host processor 302. The circuitry in the logic sectors 410 may generate intermediate results for these multi-part computations performed for the functions being accelerated. According to some embodiments, these intermediate results are transmitted to and stored in memory IC die 502 of FIG. 5 or memory IC dies 601-604 of FIG. 6 from coprocessor IC die 310. Subsequently, the intermediate results of these computations are transmitted from the memory IC die 502 or from the memory IC dies 601-604 back to coprocessor IC die 310 as these intermediate results are needed for additional parts of the computations in the logic sectors 410. Thus, the vertically stacked memory IC dies 502 and 601-604 can store the configuration data for functions being accelerated by logic sectors 410 and the intermediate results of the computations for these accelerated functions that are generated in logic sectors 410.

Figure 7:
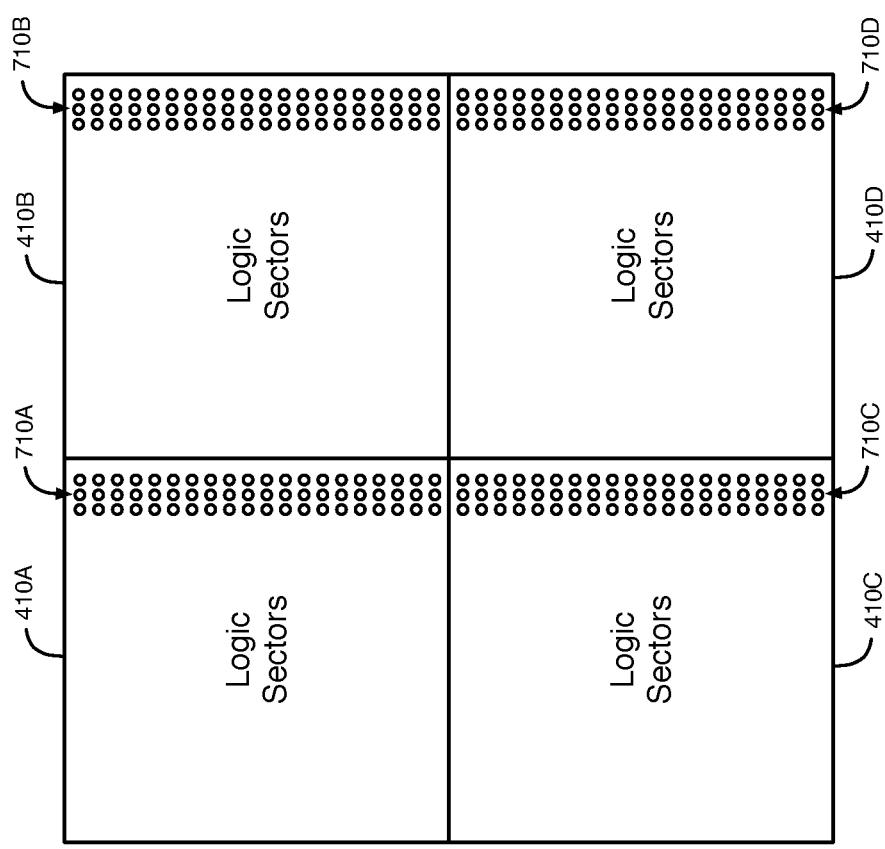
FIG. 7 illustrates examples of through-silicon vias (TSVs) in a coprocessor IC die that are used to transmit configuration data to one or more stacked memory IC dies, according to an embodiment.

FIG. 7 illustrates examples of through-silicon vias (TSVs) in a coprocessor IC die 310 that are used to transmit configuration data and/or intermediate results to one or more memory IC dies, according to an embodiment. FIG. 7 illustrates 4 exemplary logic sectors 410A-410D in coprocessor IC die 310. Logic sectors 410A-410D are examples of the logic sectors 410 shown in and described herein with respect to FIG. 4. In the embodiment of FIG. 7, each of the logic sectors 410 includes a set of through-silicon vias (TSVs) 710. As shown in FIG. 7, logic sectors 410A, 410B, 410C, and 410D include TSVs 710A, 710B, 710C, and 710D, respectively.

The TSVs 710A-710D are arranged in three columns within a strip on the right side of the respective sector 410A-410D in the perspective view shown in FIG. 7. The TSVs 710A-710D are coupled to one or more memory IC dies, such as memory IC dies 502 or 601-604 through micro-bumps 512 or 612 as shown in the respective FIG. 5 or 6. Configuration data for reconfiguration of logic circuitry in sectors 410A-410D to accelerate functions for host processor 302 may be transmitted between sectors 410A-410D and one or more of the memory IC dies 502 or 601-604 through TSVs 710A-710D, respectively. The intermediate results of the computations for the functions being accelerated may also be transmitted through TSVs 710A-710D in the coprocessor IC die 310 as shown in FIG. 7 or through other TSVs in the coprocessor IC die 310.

In the embodiment of FIG. 5, host processor 302 may load configuration data into memory IC die 502 that is to be used for partially reconfiguring logic sectors in coprocessor IC die 310 to perform functions that are to be accelerated for the host processor. In the embodiment of FIG. 6, host processor 302 may load configuration data into one or more of memory IC dies 601-604 that are to be used for partially reconfiguring logic sectors in coprocessor IC die 310 to perform functions that are to be accelerated for the host processor. Configuration data from the host processor 302 may be loaded into memory IC dies 502 or 601-604 after undergoing processing/routing through secure device manager 402 of coprocessor IC die 310 (e.g., after undergoing decompression and authentication). The configuration data may include one or more sector-level reconfiguration bit streams. When one of sectors 410 is selected to perform a function, if that sector needs to be reconfigured to perform the function (e.g., because the sector is presently configured to perform a different function), then secure device manager 402 may provide the selected sector with a pointer to the location of the necessary configuration data (e.g., persona) required to perform that function in memory IC die 502 or in one or more of memory IC dies 601-604.

In some scenarios, the memory IC die 502 or the memory IC dies 601-604 may not already have the necessary configuration data stored when the configuration data is needed by the selected sector. In this case, secure device manager 402 may retrieve the configuration data from memory external to the IC package and may load the retrieved bit stream into the selected sector and into the memory IC die 502 or the memory IC dies 601-604.

Referring to FIG. 5, configuration data for and intermediate results of computations for functions to be accelerated for a host processor may be loaded at a high bandwidth into memory IC die 502 through interface circuits 542-543 in the coprocessor IC die 302 that are coupled vertically to interface circuits 532-533 in the memory IC die 502. Interface circuits 542-543 may be coupled to interface circuits 532-533, respectively, through TSVs in coprocessor IC die 310 and through subsets of bumps 512. The interface circuits 542-543 may include transceiver circuits that are used to transmit the configuration data and intermediate results to transceiver circuits in interface circuits 532-533, respectively, for storage in the memory IC die 502. The transceiver circuits in interface circuits 542-543 may receive the configuration data and intermediate results stored in memory IC die 502 from transceiver circuits in the interface circuits 532-533, respectively. In an embodiment, the circuitry in interface circuits 532-533 may be replicas of the circuitry in interface circuits 543-544, respectively. The interface circuits 532-533 and 543-544 may, for example, use a data communication standard to transmit data between memory IC die 502 and coprocessor IC die 310. Each of the interface circuits 532-533 and 543-544 may include, for example, circuitry that implements the physical (PHY) layer protocol for a data communications standard.

Large scale model parameters for cognitive acceleration algorithms may be statically preloaded into one or more memory IC dies that are vertically stacked on the coprocessor IC die 310 as shown, for example, in FIGS. 5-6, avoiding expensive and frequent accesses to external memory. Hundreds of applications implementing functions that can be accelerated for a host processor can be buffered and deployed to (i.e. stored in) the coprocessor IC die 310 to enable nearly instantaneous readiness for execution.

By storing configuration data for and intermediate results of functions to be accelerated in vertically stacked memory IC dies, the density and performance of the memory IC dies can improve in lockstep with the coprocessor IC die through Moore's law. Memory IC technology can scale independently of the coprocessor IC die, providing options for increased memory density and bandwidth. Also, the configurations of FIGS. 5-7 do not have a significant impact on the power delivery network of the coprocessor IC die 310, because power delivery to the memory IC dies 502 and 601-604 is provided through TSVs in coprocessor die 310. If coprocessor IC die 310 is a PLD or FPGA, the process of configuring the PLD or FPGA may be a low energy process.

IC die 522 may be, for example, a memory IC die, a transceiver IC die, a mixed signal IC die, or a digital logic IC die. IC die 522 is coupled to coprocessor IC die 310 through conductors in interconnection bridge 508. IC die 522 is coupled to memory IC dies 502/601-604 through interconnection bridge 508 and TSVs in coprocessor IC die 310. Interconnection bridge 508 is coupled to IC dies 522 and 310 through micro bumps as shown in FIGS. 5-6. Configuration data and intermediate results can be transmitted from HBM IC die 524 to one or more of the memory IC dies 502 and 601-604 through interconnection bridge 510 and TSVs in coprocessor IC die 310. Interconnection bridge 510 is coupled to IC dies 524 and 310 through micro bumps as shown in FIGS. 5-6.

According to some embodiments, non-critical functions (e.g., functions for non-data path circuits) can be stored in the vertically stacked memory IC dies 502 and/or 601-604. The non-critical functions that are stored in the vertically stacked memory IC dies 502 and/or 601-604 may include, for example, caching of bit streams, authentication of bit streams, and decompression of bit streams.

Figure 8:
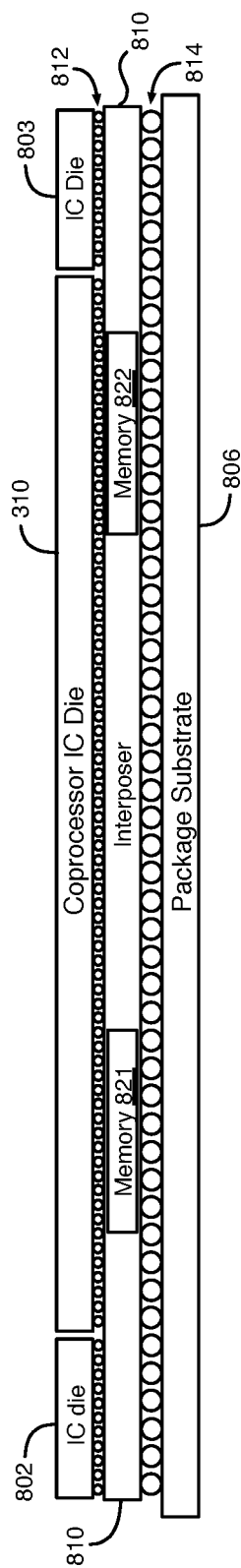
FIG. 8 illustrates an example of an interposer that stores configuration data for and/or intermediate results of functions to be accelerated by a coprocessor IC die for a host processor, according to another embodiment.

FIG. 8 illustrates an example of an interposer 810 that stores configuration data for and/or intermediate results of functions to be accelerated by a coprocessor IC die 310 for a host processor 302, according to another embodiment. The integrated circuit (IC) package shown in FIG. 8 includes interposer 810, coprocessor IC die 310, package substrate 806, and IC dies 802-803.

Interposer 810 is an active interposer that includes one, two, or more embedded memory integrated circuit (IC) dies, such as memory IC dies 821-822. The memory IC dies in interposer 810 may be, for example, SRAM IC dies, DRAM IC dies, non-volatile memory IC dies, or other types of memory IC dies. The memory IC dies 821-822 in interposer 810 may store configuration data for functions to be accelerated by coprocessor IC die 310 for host processor 302. The configuration data for these functions may be transmitted from storage in the memory IC dies 821-822 to logic sectors in coprocessor IC die 310 when the logic sectors are to be configured to perform these functions.

The embedded memory IC dies in interposer 810 may also store the intermediate results of the computations of functions being accelerated for host processor 302 by coprocessor IC die 310. The intermediate results may be transmitted from coprocessor IC die 310 to the memory IC dies 821-822. When the intermediate results are subsequently needed by the logic sectors in coprocessor IC die 310, the intermediate results are transmitted from storage in the memory IC dies 821-822 back to the logic sectors in coprocessor IC die 310.

Interposer 810 is coupled to coprocessor IC die 310 and to IC dies 802-803 through conductive micro-bumps 812. IC dies 802-803 may be, for example, memory IC dies, transceiver IC dies, mixed signal IC dies, and/or digital logic IC dies. Interposer 810 is coupled to package substrate 806 through conductive solder bumps 814. Interposer 810 may be, for example, an active through silicon interposer (ATSI) having through-silicon vias (TSVs) that couple coprocessor IC die 310 to package substrate 806 through bumps 812 and 814. These TSVs in interposer 810 may be, for example, low resolution TSVs.

Figure 9:
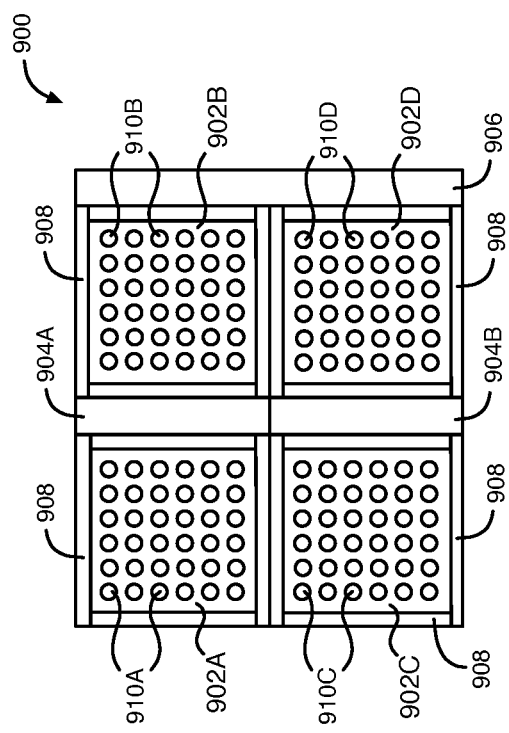
FIG. 9 illustrates examples of memory arrays in an interposer that store configuration data for and/or intermediate results of functions to be accelerated by a coprocessor IC die for a host processor, according to another embodiment.

FIG. 9 illustrates examples of memory arrays in interposer 810 that store configuration data for and/or intermediate results of functions to be accelerated by a coprocessor IC die 310 for a host processor, according to another embodiment. The circuit 900 shown in FIG. 9 includes four memory arrays 902A, 902B, 902C, and 902D. Circuit 900, including memory arrays 902A-902D, is embedded inside interposer 810. Circuit 900 may be, for example, a memory integrated circuit die, such as an SRAM or DRAM, including the four memory arrays 902A-902D. In this embodiment, circuit 900 is an example of each of memory IC dies 821 and 822. Alternatively, memory arrays 902A-902D may be four separate memory IC dies.

Each of the four memory arrays 902A-902D includes numerous memory cells that store configuration data for and/or intermediate results of computations for functions to be accelerated by a coprocessor IC die 310 for host processor 302. Each of the four memory arrays 902A-902D is surrounded on its four sides by a network of conductors 908. Conductors 908 may transmit the configuration data and the intermediate results between the memory cells in the respective memory arrays 902A-902D.

The four memory arrays 902A-902D include through-silicon vias (TSVs) 910A-910D, respectively. TSVs 910A-910D pass through one or more layers of circuit 900. TSVs 910A-910D may be coupled to TSVs in interposer 810 that extend from circuit 900 to the upper surface of interposer 810 that faces coprocessor IC die 310. 36 TSVs 910 are shown in each of the four memory arrays 902A-902D merely as an example. The configuration data for and the intermediate results of the functions to be accelerated may be transmitted between the memory cells in memory arrays 902A-902D and coprocessor IC die 310 through the TSVs 910A-910D, respectively, through TSVs in interposer 810, and through subsets of the micro-bumps 812. TSVs 910A-910D may also be coupled to package substrate 806 through subsets of bumps 814.

Circuit 900 also includes input/output interface circuits 904A-904B and 906. Interface circuits 904A-904B and 906 may, for example, be used to transmit configuration data for and the intermediate results of the functions to be accelerated between memory arrays 902A-902D and/or to other memory arrays in interposer 810.

Figure 10:
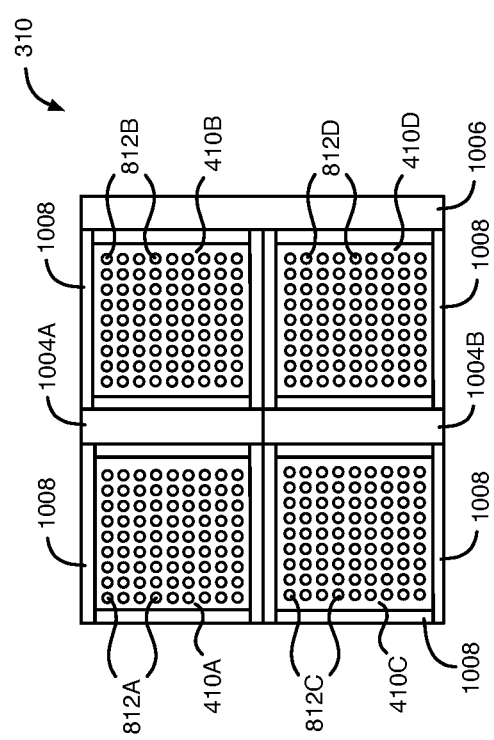
FIG. 10 illustrates examples of logic sectors within a coprocessor IC die that are coupled to micro bumps, according to an embodiment.

FIG. 10 illustrates examples of logic sectors 410 within coprocessor IC die 310 that are coupled to micro bumps 812, according to an embodiment. Four logic sectors 410A, 410B, 410C, and 410D are shown in FIG. 10 in coprocessor IC die 310 as an example. Coprocessor IC die 310 may have numerous other logic sectors 410. Logic sectors 410A-410D are coupled to micro bumps 812A-812D, respectively.

Logic sectors 410A-410D have TSVs 710A-710D, respectively, as shown in FIG. 7. Each of the TSVs 710A-710D may be coupled to a respective one of the micro bumps 812A-812D. The configuration data for and the intermediate results of the functions to be accelerated may be transmitted between the memory IC dies 821-822 in interposer 810 and the logic sectors 410A-410D in coprocessor IC die 310 through connections that include the TSVs 910A-910D in circuit 900, micro bumps 812A-812D and the TSVs 710A-710D, respectively. These connections from the memory circuits 821-822 in interposer 810 to the logic sectors 410 in coprocessor IC die 310 are high-speed face-to-face connections. The configuration data for the functions to be accelerated may be stored in configuration memory cells (e.g., configuration RAM) within the logic sectors 410. Coprocessor IC die 310 may include data and address registers that are used to access these configuration memory cells.

Each of the logic sectors 410A-410D is surrounded on its four sides by a network of conductors 1008. Conductors 1008 can transmit the configuration data for and the intermediate results of the functions to be accelerated between the logic sectors 410 in coprocessor IC die 310.

Coprocessor IC die 310 also includes input/output interface circuits 1004A-1004B and 1006. Interface circuits 1004A-1004B and 1006 may, for example, be used to transmit configuration data for and the final and intermediate results of the functions to be accelerated between logic sectors 410 in coprocessor IC die 310.

According to some embodiments, power clamps, electrostatic discharge (ESD) circuits, input/output (IO) circuits, and any other non-speed-critical circuits may be integrated into the active interposer 810. An active interposer 810 with embedded memory circuits and other active circuitry may be used with a standard heat sink for a high-end, high-performance coprocessor IC die 310, because the IC die that generates the most heat in the IC package (e.g., the coprocessor 310) can be directly attached to the heat sink.

According to some embodiments, non-critical functions (e.g., functions for non-data path circuits) can be performed by or stored in active circuitry in interposer 810, such as the memory circuits 821-822. The non-critical functions that are performed by or stored in the active circuits in interposer 810 may include, for example, caching of bit streams, authentication of bit streams, and decompression of bit streams.

The active interposer 810 may also provide three dimensional localized downloading of partial configuration bit streams (such as per sector) directly into the LSM 412 of a logic sector 410 or into the address and data registers in a sector 410. A small or limited number of application accelerators (e.g., including partial configuration bit streams) can be buffered and stored in configuration memory cells in coprocessor IC die 310 to enable nearly instantaneous readiness for execution of the accelerator functions by one or more of the logic sectors 410 configured by the corresponding configuration data.

Figure 11:
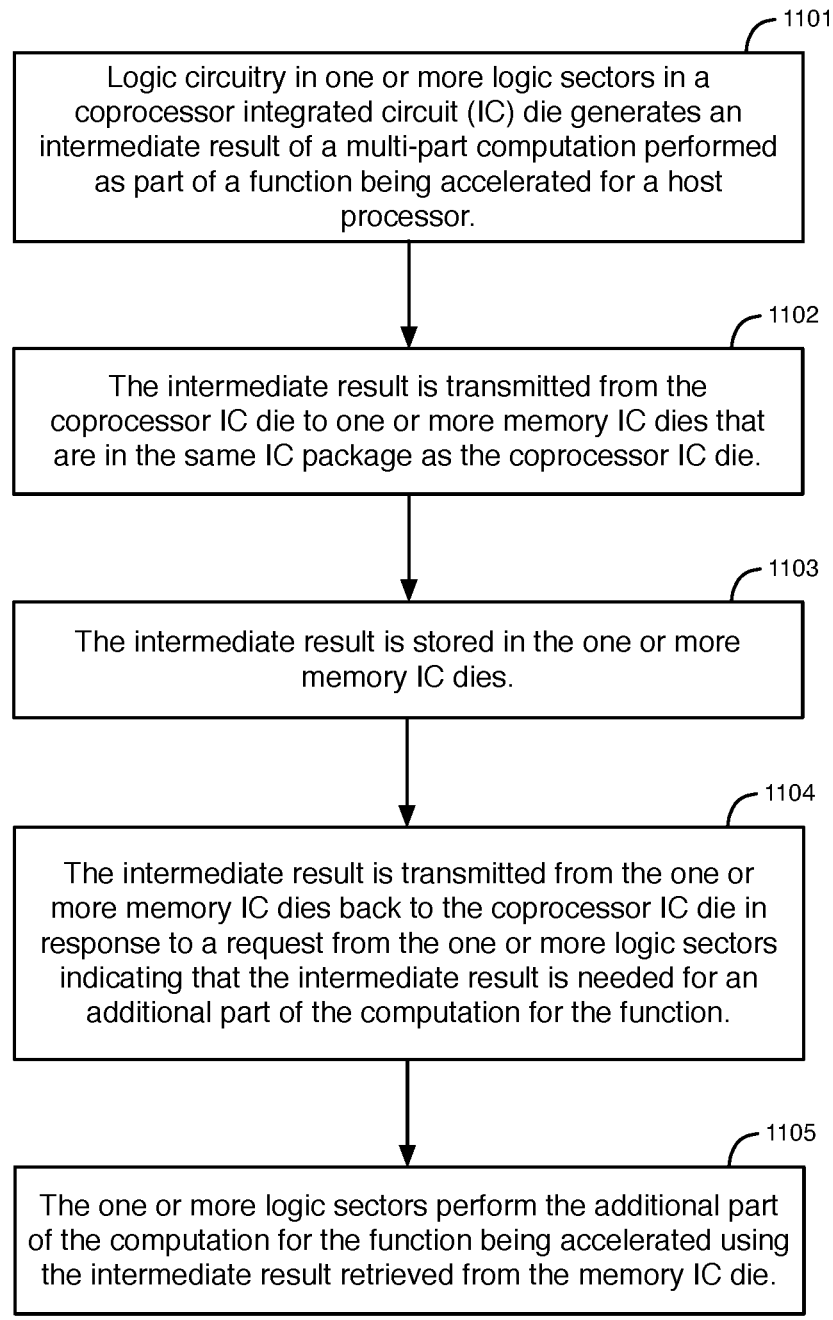
FIG. 11 illustrates examples of operations that may be performed by a coprocessor IC die and one or more memory IC dies for providing and storing an intermediate result of a multi-part computation for a function being accelerated for a host processor, according to an embodiment.

Coprocessor IC die 310 and the memory IC dies 502, 601-604, 821-822, and 900 disclosed herein in connection with FIGS. 5-10 may perform operations for providing and storing intermediate results of multi-part computations that are performed by the coprocessor IC die to accelerate functions for a host processor. FIG. 11 illustrates examples of operations that may be performed by a coprocessor IC die and one or more memory IC dies for providing and storing an intermediate result of a multi-part computation for a function being accelerated for a host processor, according to an embodiment. FIG. 11 illustrates operations 1101-1105.

In operation 1101, logic circuitry in one or more logic sectors in a coprocessor IC die (e.g., one or more of logic sectors 410) generates an intermediate result of a multi-part computation performed as part of a function being accelerated for a host processor (e.g., host processor 302). In operation 1102, the intermediate result is transmitted from the coprocessor IC die to one or more memory IC dies (e.g., one or more of memory IC dies 502, 601-604, 821-822, and 900) that are in the same IC package as the coprocessor IC die (e.g., coprocessor IC die 310). The transmission of the intermediate result to the one or more memory IC dies may be, for example, controlled by a local sector manager 412 and/or secure device manager 402. In operation 1103, the intermediate result is then stored in the one or more memory IC dies. In some embodiments, the coprocessor IC die may not have enough available storage space to store all of the intermediate results of the computations for functions being accelerated for a host processor. In operation 1104, the intermediate result is transmitted from the one or more memory IC dies back to the coprocessor IC die in response to a request from the one or more logic sectors indicating that the intermediate result is needed for an additional part of the computation for the function being accelerated. In operation 1105, the one or more logic sectors perform the additional part of the computation for the function being accelerated using the intermediate result retrieved from the memory IC die.

Figure 12:
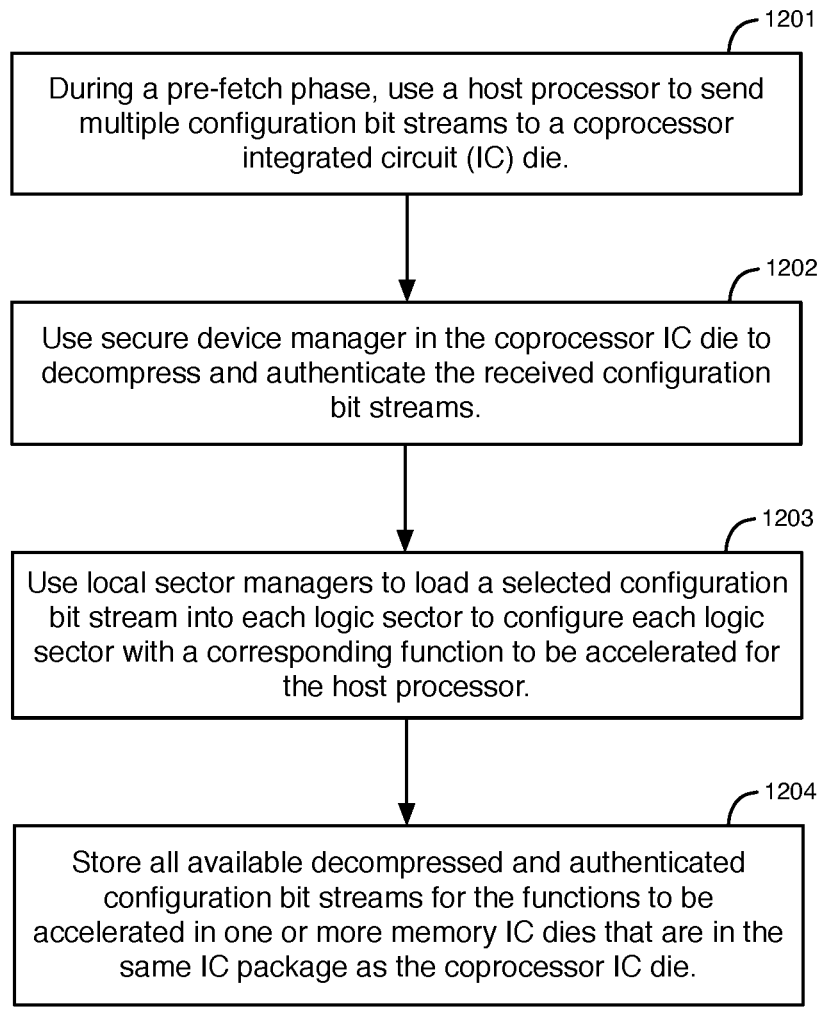
FIG. 12 illustrates examples of operations that may be performed by a coprocessor IC die and one or more memory IC dies for receiving and storing configuration data from a host processor during a pre-fetch phase of an instruction cycle, according to an embodiment.

Coprocessor IC die 310 and the memory IC dies 502, 601-604, 821-822, and 900 disclosed herein in connection with FIGS. 5-10 may perform operations for receiving and storing configuration data from a host processor during a pre-fetch phase of an instruction cycle. FIG. 12 illustrates examples of operations that may be performed by a coprocessor IC die and one or more memory IC dies for receiving and storing configuration data from a host processor during a pre-fetch phase of an instruction cycle, according to an embodiment. FIG. 12 illustrates operations 1201-1204.

In operation 1201, a pre-fetch phase is initiated by a host processor (e.g., host processor 302 of FIG. 3) for a set of anticipated configuration bit streams (e.g., corresponding to functions to be accelerated for the host processor). These configuration bit streams may be provided to a coprocessor IC die (e.g., coprocessor IC die 310).

In operation 1202, a secure device manager (SDM) within the coprocessor IC die (e.g., secure device manager 402 of FIG. 4) may receive the configuration bit streams from the host processor and may perform decompression and authentication operations on the received configuration bit streams.

In operation 1203, local sector managers within the coprocessor IC die (e.g., local sector managers 412 of FIG. 4) may be used to load a selected configuration bit stream into each logic sector to configure each logic sector with a corresponding function to be accelerated for the host processor (e.g., to configure each logic sector to perform a particular function to be accelerated for the host processor).

In operation 1204, all available decompressed and authenticated configuration bit streams for the functions to be accelerated are transmitted to and stored in one or more memory IC dies (e.g., memory IC dies 502, 601-604, 821-822, or 900) that are in the same IC package as the coprocessor IC die (e.g., coprocessor IC die 310).

By storing decompressed and authenticated configuration bit streams in in-package memory IC dies in this way, the configuration data indicated by these bit streams may be readily accessed for reconfiguring logic sectors with greater speed and power efficiency compared to traditional methods in which configuration bit streams are only retrieved from outside the package.

Figure 13:
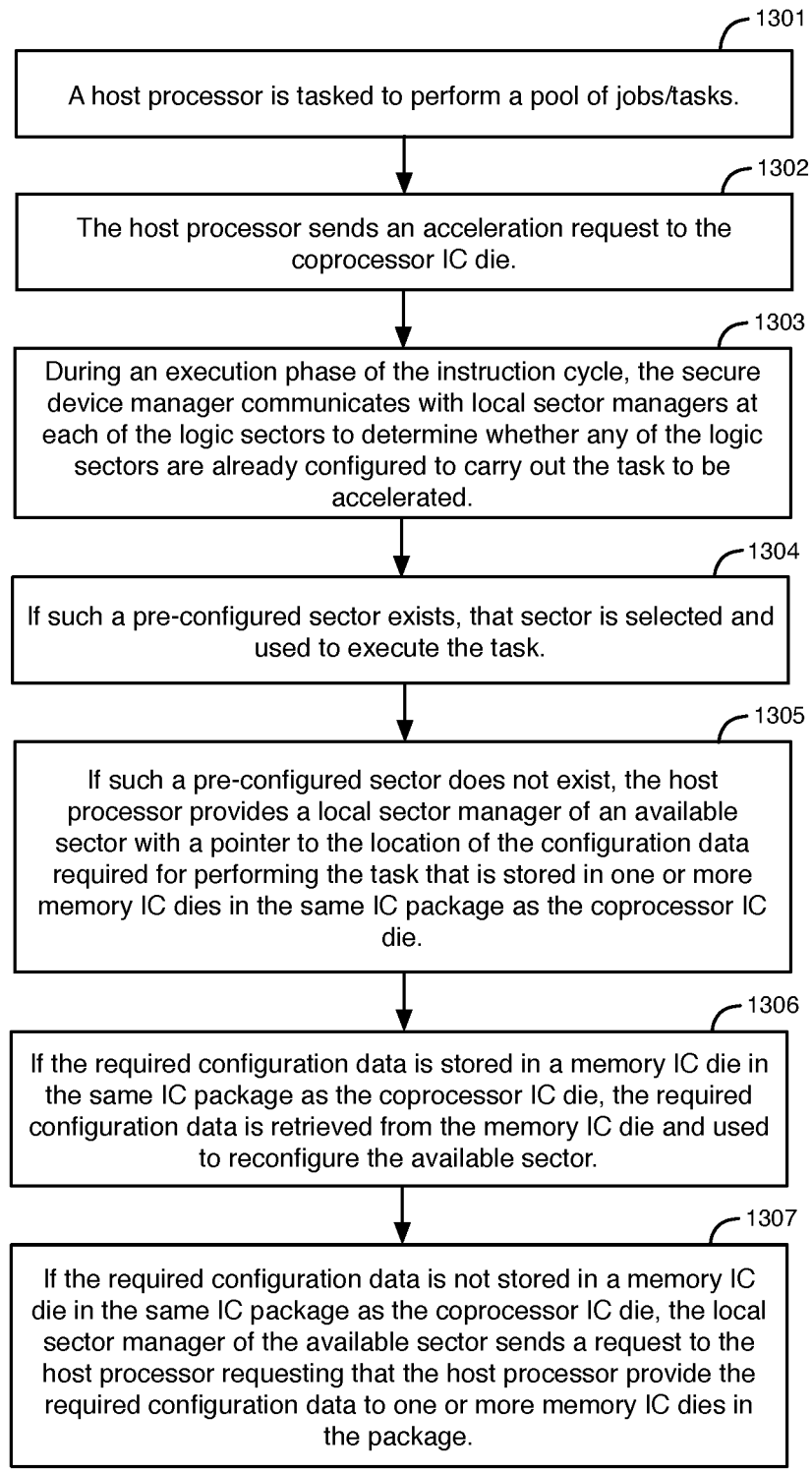
FIG. 13 illustrates examples of operations that may be performed by a coprocessor IC die and one or more memory IC dies for managing sectors to perform a pool of jobs and/or tasks received from a host processor, according to an embodiment.

Coprocessor IC die 310 and the memory IC dies 502, 601-604, 821-822, and 900 disclosed herein in connection with FIGS. 5-10 may perform operations for managing sectors to perform a pool of jobs/tasks received from a host processor. FIG. 13 illustrates examples of operations that may be performed by a coprocessor IC die and one or more memory IC dies for managing sectors to perform a pool of jobs and/or tasks received from a host processor. FIG. 13 illustrates operations 1301-1307.

In operation 1301, a host processor (e.g., host processor 302 of FIG. 3) is tasked to perform a pool of jobs/tasks. In order to improve the speed at which these tasks are performed (e.g., to accelerate the tasks), a coprocessor IC die (e.g., coprocessor IC die 310) may be used to perform at least a subset of the pool of tasks.

In operation 1302, the host processor sends an acceleration request to the coprocessor IC die. This acceleration request may be received by a secure device manager (e.g., secure device manager 402 of FIG. 4) in the coprocessor IC die, which may identify one or more logic sectors (e.g., logic sectors 410 of FIG. 4) that are available to perform one or more tasks associated with the acceleration request.

In operation 1303, during an execution phase of the instruction cycle, the secure device manager communicates with local sector managers (e.g., local sector managers 412 of FIG. 4) at each of the logic sectors to determine whether any of the logic sectors are already configured to carry out the task to be accelerated. Depending on whether a sector exists that is pre-configured to carry out the task, the process of FIG. 13 may proceed to either operation 1304 or operation 1305. In operation 1304, if such a pre-configured sector exists, that sector may be selected and used to execute the task.

In operation 1305, if such a pre-configured sector does not exist, the host processor provides a local sector manager of an available sector with a pointer to the location of the configuration data required for performing the task that is stored in one or more memory IC dies (e.g., one or more of memory IC dies 502, 601-604, 821-822, or 900) in the same IC package as the coprocessor IC die. Configuration data stored in the memory IC die may be unencrypted. However, it is possible that the required configuration data may not be present in one of the memory IC dies within the same package as the coprocessor IC die. Thus, the local sector manager may check to determine whether the required configuration data is present in one or more of the memory IC dies in the package. If the required configuration data is stored in one or more of the memory IC dies in the package (e.g., one or more of memory IC dies 502, 601-604, 821-822, or 900), then the process may proceed to operation 1306. Otherwise, the process may proceed to operation 1307.

In operation 1306, if the required configuration data is stored in a memory IC die (e.g., if there is a cache hit) in the same IC package as the coprocessor IC die, the required configuration data is retrieved from the memory IC die and used to reconfigure the available sector (e.g., by loading the required configuration bit stream into the available sector). The configuration data stored in the memory IC die may not be encrypted. The memory IC die may act as an instruction cache from which configuration data (e.g., bit streams) are fetched by the local sector managers for reconfiguring the logic sectors.

In operation 1307, if the required configuration data is not stored in a memory IC die (e.g., if there is a cache miss) in the same IC package as the coprocessor IC die, the local sector manager of the available sector may send a request to the host processor requesting that the host processor provide the required configuration data to one or more memory IC dies in the package. The local sector manager may then load the required configuration data into the available sector, thereby reconfiguring the available sector. In some scenarios, the local sector manager may receive the required configuration data from the host processor directly through the secure device manager, in which case the required configuration data may also be stored in a memory IC die in the package.

The embodiments disclosed herein may be incorporated into any suitable integrated circuit. For example, the embodiments may be incorporated into numerous types of devices such as programmable logic integrated circuits, application specific standard products (ASSPs), and application specific integrated circuits (ASICs). Examples of programmable logic integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic integrated circuits described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic integrated circuits can be used to perform a variety of different logic functions. For example, a programmable logic integrated circuit can be configured as a processor or controller that works in cooperation with a system processor. The programmable logic integrated circuit may also be used as an arbiter for arbitrating access to a shared resource in the data processing system. In yet another example, the programmable logic integrated circuit can be configured as an interface between a processor and one of the other components in the system.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

The following examples pertain to further embodiments. Example 1 is an integrated circuit package comprising: a memory integrated circuit die; and a coprocessor integrated circuit die coupled to the memory integrated circuit die, wherein the coprocessor integrated circuit die comprises a logic sector that is configured to accelerate a function for a host processor, wherein the logic sector generates an intermediate result of a computation performed as part of the function, and wherein the intermediate result is transmitted to and stored in the memory integrated circuit die.

In Example 2, the subject matter of Example 1 can optionally include wherein the intermediate result is transmitted from the memory integrated circuit die back to the coprocessor integrated circuit die in response to a request from the logic sector, and wherein the logic sector performs an additional part of the computation for the function using the intermediate result retrieved from the memory integrated circuit die.

In Example 3, the subject matter of any one of Examples 1-2 can optionally include wherein the memory integrated circuit die is stacked on top of the coprocessor integrated circuit die and coupled to the coprocessor integrated circuit die through first conductive bumps.

In Example 4, the subject matter of any one of Examples 1-3 can optionally include wherein the logic sector generates an additional intermediate result of the computation that is stored in an additional memory integrated circuit die, and wherein the additional memory integrated circuit die is stacked on top of the coprocessor integrated circuit die and coupled to the coprocessor integrated circuit die through second conductive bumps.

In Example 5, the subject matter of any one of Examples 1-4 can optionally include wherein the intermediate result is transmitted from a first interface circuit in the coprocessor integrated circuit die to a second interface circuit in the memory integrated circuit die, and wherein the second interface circuit is a replica of the first interface circuit.

In Example 6, the subject matter of any one of Examples 1-2 can optionally include wherein the memory integrated circuit die is embedded in an interposer, and wherein the coprocessor integrated circuit die is coupled to the interposer through conductive bumps.

In Example 7, the subject matter of any one of Examples 1-6 can optionally include wherein the memory integrated circuit die comprises through-silicon vias, and wherein the intermediate result is transmitted to the memory integrated circuit die through the through-silicon vias.

In Example 8, the subject matter of any one of Examples 1-7 can optionally include wherein the coprocessor integrated circuit die comprises through-silicon vias, and wherein the intermediate result is transmitted to the memory integrated circuit die through the through-silicon vias.

In Example 9, the subject matter of any one of Examples 1-8 can optionally include wherein the coprocessor integrated circuit die is a programmable logic integrated circuit, and the memory integrated circuit die is a random access memory integrated circuit.

Example 10 is an integrated circuit package comprising: a package substrate; an interposer coupled to the package substrate, wherein the interposer comprises a memory integrated circuit die that is embedded in the interposer; and a coprocessor integrated circuit die coupled to the interposer and to the memory integrated circuit die, wherein the coprocessor integrated circuit die comprises a logic sector, and wherein the memory integrated circuit die stores configuration data for configuring the logic sector to accelerate a function for a host processor.

In Example 11, the subject matter of Example 10 can optionally include wherein the configuration data is transmitted from the memory integrated circuit die to the coprocessor integrated circuit die via through-silicon vias in the interposer, and wherein the logic sector is configured with the configuration data retrieved from the memory integrated circuit die to perform the function for the host processor.

In Example 12, the subject matter of any one of Examples 10-11 can optionally include wherein the logic sector generates an intermediate result of a computation performed as part of the function, and wherein the intermediate result is transmitted to and stored in the memory integrated circuit die.

In Example 13, the subject matter of Example 12 can optionally include wherein the intermediate result is transmitted from the memory integrated circuit die back to the coprocessor integrated circuit die in response to a request from the logic sector, and wherein the logic sector performs an additional part of the computation for the function using the intermediate result retrieved from the memory integrated circuit die.

In Example 14, the subject matter of any one of Examples 10-13 can optionally include wherein the memory integrated circuit die is coupled to the coprocessor integrated circuit die via conductive bumps between a surface of the interposer and the coprocessor integrated circuit die and though-silicon vias in the interposer that extend from the memory integrated circuit die to the surface of the interposer.

In Example 15, the subject matter of any one of Examples 10-14 can optionally include wherein a secure device manager in the coprocessor integrated circuit die communicates with a local sector manager at the logic sector to determine whether the logic sector is configured to carry out the function, and if the secure device manager determines that the logic sector is not configured to perform the function, the configuration data is retrieved from the memory integrated circuit die and the logic sector is configured with the retrieved configuration data to perform the function.

Example 16 is a method for storing data in a memory integrated circuit die, the method comprising: generating an intermediate result of a computation that is performed as part of a function being accelerated for a host processor with a logic sector that is part of a coprocessor integrated circuit die; transmitting the intermediate result from the coprocessor integrated circuit die to the memory integrated circuit die, wherein the memory integrated circuit die and the coprocessor integrated circuit die are coupled together within an integrated circuit package; storing the intermediate result in the memory integrated circuit die; transmitting the intermediate result from the memory integrated circuit die to the coprocessor integrated circuit die in response to a request from the logic sector; and performing an additional part of the computation for the function with the logic sector using the intermediate result received from the memory integrated circuit die.

In Example 17, the subject matter of Example 16 can optionally include wherein the memory integrated circuit die is stacked on top of the coprocessor integrated circuit die and coupled to the coprocessor integrated circuit die through conductive bumps.

In Example 18, the subject matter of Example 16 can optionally include wherein the memory integrated circuit die is embedded in an interposer, wherein the coprocessor integrated circuit die is coupled to the interposer through first conductive bumps, and wherein the interposer is coupled to a package substrate through second conductive bumps.

In Example 19, the subject matter of any one of Examples 16-18 can optionally include generating an additional intermediate result of the computation with the logic sector; and storing the additional intermediate result in an additional memory integrated circuit die, wherein the additional memory integrated circuit die is stacked on the coprocessor integrated circuit die and is in the integrated circuit package with the coprocessor integrated circuit die.

In Example 20, the subject matter of Example 19 can optionally include transmitting the additional intermediate result from the additional memory integrated circuit die to the coprocessor integrated circuit die in response to a request from the logic sector; and performing a further part of the computation for the function with the logic sector using the additional intermediate result received from the additional memory integrated circuit die.

Example 21 is a computer-readable non-transitory medium storing executable instructions for storing data in a memory integrated circuit die, the executable instructions comprising: instructions executable by a logic sector in a coprocessor integrated circuit die to generate an intermediate result of a computation that is performed as part of a function being accelerated for a host processor; instructions executable by the coprocessor integrated circuit die to transmit the intermediate result to the memory integrated circuit die, wherein the memory integrated circuit die and the coprocessor integrated circuit die are coupled together within an integrated circuit package; instructions executable by the memory integrated circuit die to store the intermediate result in memory cells in the memory integrated circuit die; instructions executable by the memory integrated circuit die to transmit the intermediate result from the memory cells to the coprocessor integrated circuit die in response to a request from the logic sector; and instructions executable by the logic sector in the coprocessor integrated circuit die to perform an additional part of the computation for the function using the intermediate result received from the memory integrated circuit die.

In Example 22, the subject matter of Example 21 can optionally include wherein the memory integrated circuit die is stacked on top of the coprocessor integrated circuit die and coupled to the coprocessor integrated circuit die through conductive bumps.

In Example 23, the subject matter of Example 21 can optionally include wherein the memory integrated circuit die is embedded in an interposer, wherein the coprocessor integrated circuit die is coupled to the interposer through first conductive bumps, and wherein the interposer is coupled to a package substrate through second conductive bumps.

In Example 24, the subject matter of any one of Examples 21-23 can optionally include instructions executable by the logic sector in the coprocessor integrated circuit die to generate an additional intermediate result of the computation; instructions executable by the coprocessor integrated circuit die to transmit the additional intermediate result to an additional memory integrated circuit die, wherein the additional memory integrated circuit die is stacked on the coprocessor integrated circuit die and is in the integrated circuit package with the coprocessor integrated circuit die; and instructions executable by the additional memory integrated circuit die to store the additional intermediate result in memory cells in the additional memory integrated circuit die.

In Example 25, the subject matter of any one of Examples 21-24 can optionally include wherein the coprocessor integrated circuit die is a programmable logic integrated circuit.

Example 26 is a method for storing data, the method comprising: loading configuration data into a logic sector of a coprocessor integrated circuit die to configure the logic sector to perform a function to be accelerated for a host processor; and storing the configuration data in a memory integrated circuit die, wherein the memory integrated circuit die is embedded in an interposer, wherein the interposer is coupled to a package substrate, wherein the coprocessor integrated circuit die is coupled to the interposer and to the memory integrated circuit die, and wherein the interposer, the coprocessor integrated circuit die, and the package substrate are in a package.

In Example 27, the subject matter of Example 26 can optionally include transmitting the configuration data from the memory integrated circuit die to the coprocessor integrated circuit die via through-silicon vias in the interposer.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit package comprising:
    a memory integrated circuit die;
    first conductive bumps coupled to the memory integrated circuit die; and
    a coprocessor integrated circuit die coupled to the first conductive bumps and to the memory integrated circuit die through the first conductive bumps, wherein the coprocessor integrated circuit die comprises a logic sector that is configured to accelerate a function for a host processor, wherein the logic sector generates an intermediate result of a computation performed as part of the function, wherein the intermediate result is transmitted from the coprocessor integrated circuit die through the first conductive bumps to the memory integrated circuit die without the intermediate result being transmitted through a processor circuit, wherein the intermediate result is stored in the memory integrated circuit die, and
    wherein a secure device manager in the coprocessor integrated circuit die communicates with a local sector manager at the logic sector to determine whether the logic sector is configured to perform the function, and wherein if the secure device manager determines that the logic sector is not configured to perform the function, the host processor provides the local sector manager with a pointer to a location of configuration data stored in the memory integrated circuit die for performing the function, the configuration data is retrieved from the memory integrated circuit die, and the logic sector is configured with the retrieved configuration data to perform the function.

2. The integrated circuit package of claim 1, wherein the intermediate result is transmitted from the memory integrated circuit die back to the coprocessor integrated circuit die in response to a request from the logic sector without the intermediate result being transmitted through a processor circuit, and wherein the logic sector performs an additional part of the computation for the function using the intermediate result retrieved from the memory integrated circuit die.

3. The integrated circuit package of claim 1, wherein the memory integrated circuit die is stacked on top of the coprocessor integrated circuit die.

4. The integrated circuit package of claim 3, wherein the logic sector generates an additional intermediate result of the computation that is stored in an additional memory integrated circuit die, and wherein the additional memory integrated circuit die is stacked on top of the coprocessor integrated circuit die and coupled to the coprocessor integrated circuit die through second conductive bumps.

5. The integrated circuit package of claim 3, wherein the intermediate result is transmitted from a first interface circuit in the coprocessor integrated circuit die to a second interface circuit in the memory integrated circuit die, and wherein the second interface circuit is a replica of the first interface circuit.

6. The integrated circuit package of claim 1, wherein the memory integrated circuit die is embedded in an interposer, and wherein the coprocessor integrated circuit die is coupled to the interposer through the first conductive bumps.

7. The integrated circuit package of claim 6, wherein the memory integrated circuit die comprises through-silicon vias, and wherein the intermediate result is transmitted to the memory integrated circuit die through the through-silicon vias.

8. The integrated circuit package of claim 1, wherein the coprocessor integrated circuit die comprises through-silicon vias, and wherein the intermediate result is transmitted to the memory integrated circuit die through the through-silicon vias.

9. The integrated circuit package of claim 1, wherein the coprocessor integrated circuit die is a programmable logic integrated circuit, and the memory integrated circuit die is a random access memory integrated circuit.

10. An integrated circuit package comprising:
a package substrate;
an interposer coupled to the package substrate, wherein the interposer comprises a memory integrated circuit die that is embedded in the interposer; and
a coprocessor integrated circuit die coupled to the interposer and to the memory integrated circuit die, wherein the coprocessor integrated circuit die comprises a logic sector, wherein the memory integrated circuit die stores configuration data for configuring the logic sector to accelerate a function for a host processor, wherein the logic sector generates an intermediate result of a computation performed as part of the function, and wherein the intermediate result is transmitted to and stored in the memory integrated circuit die without the intermediate result being transmitted through a processor circuit,
wherein a secure device manager in the coprocessor integrated circuit die communicates with a local sector manager at the logic sector to determine whether the logic sector is configured to carry out the function, and wherein if the secure device manager determines that the logic sector is not configured to perform the function, the host processor provides the local sector manager with a pointer to a location of the configuration data in the memory integrated circuit die for performing the function, the configuration data is retrieved from the memory integrated circuit die, and the logic sector is configured with the retrieved configuration data to perform the function.

11. The integrated circuit package of claim 10, wherein the configuration data is transmitted from the memory integrated circuit die to the coprocessor integrated circuit die via through-silicon vias in the interposer.

12. The integrated circuit package of claim 11, wherein the coprocessor integrated circuit die is a programmable logic integrated circuit.

13. The integrated circuit package of claim 12, wherein the intermediate result is transmitted from the memory integrated circuit die back to the coprocessor integrated circuit die in response to a request from the logic sector, and wherein the logic sector performs an additional part of the computation for the function using the intermediate result retrieved from the memory integrated circuit die.

14. The integrated circuit package of claim 10, wherein the memory integrated circuit die is coupled to the coprocessor integrated circuit die via conductive bumps between a surface of the interposer and the coprocessor integrated circuit die and though-silicon vias in the interposer that extend from the memory integrated circuit die to the surface of the interposer.

15. The integrated circuit package of claim 10, wherein if additional configuration data is not stored in the integrated circuit package, the local sector manager sends a request to the host processor requesting that the host processor provide the additional configuration data to the memory integrated circuit die, and wherein the local sector manager loads the additional configuration data into the logic sector to reconfigure the logic sector.

16. A method for storing data in a memory integrated circuit die, the method comprising:
communicating with a local sector manager at a logic sector that is part of a coprocessor integrated circuit die to determine whether the logic sector is configured to perform a function using a secure device manager in the coprocessor integrated circuit die;
if the secure device manager determines that the logic sector is not configured to perform the function, providing the local sector manager with a pointer to a location of configuration data stored in the memory integrated circuit die for performing the function, retrieving the configuration data from the memory integrated circuit die, and configuring the logic sector with the retrieved configuration data to perform the function;
generating an intermediate result of a computation that is performed as part of the function being accelerated for a host processor with the logic sector;
transmitting the intermediate result from the coprocessor integrated circuit die to the memory integrated circuit die through first conductive bumps without the intermediate result being transmitted through a processor circuit, wherein the memory integrated circuit die and the coprocessor integrated circuit die are coupled together through the first conductive bumps within an integrated circuit package;
storing the intermediate result in the memory integrated circuit die;
transmitting the intermediate result from the memory integrated circuit die through the first conductive bumps to the coprocessor integrated circuit die in response to a request from the logic sector without the intermediate result being transmitted through a processor circuit; and performing an additional part of the computation for the function with the logic sector using the intermediate result received from the memory integrated circuit die.

17. The method of claim 16, wherein the memory integrated circuit die is stacked on top of the coprocessor integrated circuit die and coupled to the coprocessor integrated circuit die through the first conductive bumps.

18. The method of claim 16, wherein the memory integrated circuit die is embedded in an interposer, wherein the coprocessor integrated circuit die is coupled to the interposer through the first conductive bumps, and wherein the interposer is coupled to a package substrate through second conductive bumps.

19. The method of claim 16 further comprising:
generating an additional intermediate result of the computation with the logic sector; and
storing the additional intermediate result in an additional memory integrated circuit die, wherein the additional memory integrated circuit die is stacked on the coprocessor integrated circuit die and is in the integrated circuit package with the coprocessor integrated circuit die.

20. The method of claim 19 further comprising:
transmitting the additional intermediate result from the additional memory integrated circuit die to the coprocessor integrated circuit die in response to a request from the logic sector; and
performing a further part of the computation for the function with the logic sector using the additional intermediate result received from the additional memory integrated circuit die.

* * * * *